United States Patent
Barkam et al.

(10) Patent No.: US 11,731,231 B2
(45) Date of Patent: Aug. 22, 2023

(54) POLISHING SYSTEM, POLISHING PAD, AND RELATED METHODS

(71) Applicant: Micron Technology, Inc., Boise, ID (US)

(72) Inventors: Swetha Barkam, Boise, ID (US); Khiam-How Low, Boise, ID (US); James A. Cultra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1090 days.

(21) Appl. No.: 16/259,832

(22) Filed: Jan. 28, 2019

(65) Prior Publication Data

US 2020/0238471 A1     Jul. 30, 2020

(51) Int. Cl.

| | |
|---|---|
| *B24B 37/005* | (2012.01) |
| *B24B 37/26* | (2012.01) |
| *H01L 21/306* | (2006.01) |
| *B24B 41/06* | (2012.01) |

(52) U.S. Cl.
CPC ............ *B24B 37/005* (2013.01); *B24B 37/26* (2013.01); *B24B 41/06* (2013.01); *H01L 21/30625* (2013.01)

(58) Field of Classification Search
CPC ....... B24B 37/005; B24B 37/26; B24B 41/06; B24B 37/10
USPC ................................. 451/285, 11, 5
See application file for complete search history.

(56) References Cited

U.S. PATENT DOCUMENTS

| | | | |
|---|---|---|---|
| 5,240,552 A | * | 8/1993 | Yu ............................ B24B 37/04 438/959 |
| 5,609,719 A | | 3/1997 | Hempel |
| 6,093,089 A | | 7/2000 | Chen et al. |
| 6,241,587 B1 | | 6/2001 | Drill et al. |

(Continued)

FOREIGN PATENT DOCUMENTS

| | | |
|---|---|---|
| CN | 101238552 A | 8/2008 |
| CN | 101484979 A | 7/2009 |

(Continued)

OTHER PUBLICATIONS

"Orthogonal." Merriam-Webster.com Dictionary, Merriam-Webster, https://www.merriam-webster.com/dictionary/orthogonal. Accessed Jun. 15, 2022 (Year: 2022).*

(Continued)

*Primary Examiner* — Joel D Crandall
(74) *Attorney, Agent, or Firm* — TraskBritt

(57) ABSTRACT

A chemical-mechanical polishing system includes a rotatable head for mounting a wafer thereto, a polishing pad mounted to a rotatable platen, and a fluid dispenser for dispensing a fluid onto a surface of the polishing pad. The polishing pad includes an array of piezoelectric actuators. The chemical-mechanical polishing system includes a controller operably coupled to each piezoelectric actuator. The controller measures voltages output by the piezoelectric actuators of the array, determines, qualitatively, a topography of the wafer surface based on the measured voltages, and adjusts an aggressiveness of at least one portion of the polishing pad based on the determined topography. The controller adjusts the aggressiveness by inducing the piezoelectric effect or reverse piezoelectric effect in one or more piezoelectric actuators to adjust a surface topography of the polishing pad.

23 Claims, 5 Drawing Sheets

(56) References Cited

U.S. PATENT DOCUMENTS

| | | | |
|---|---|---|---|
| 6,520,834 B1* | 2/2003 | Marshall | B24B 37/11 |
| | | | 451/550 |
| 2002/0009953 A1 | 1/2002 | Swanson | |
| 2004/0214509 A1 | 10/2004 | Elledge | |
| 2006/0135040 A1* | 6/2006 | Herold | B24B 37/30 |
| | | | 451/41 |
| 2007/0149094 A1* | 6/2007 | Choi | B24B 37/20 |
| | | | 451/8 |
| 2007/0167110 A1* | 7/2007 | Tseng | B24B 37/30 |
| | | | 451/5 |
| 2008/0207100 A1 | 8/2008 | Roy et al. | |
| 2009/0053976 A1 | 2/2009 | Roy et al. | |
| 2016/0107288 A1 | 4/2016 | Orilall et al. | |
| 2020/0035495 A1* | 1/2020 | Xu | H01L 21/30625 |

FOREIGN PATENT DOCUMENTS

| | | | | |
|---|---|---|---|---|
| CN | 102133730 | | 9/2012 | |
| JP | 09-260316 A | | 10/1997 | |
| JP | 2008-535643 A | | 9/2008 | |
| JP | 2009-260316 A | | 11/2009 | |
| JP | 2010-003808 | | 1/2010 | |
| KR | 10-2007-0116042 A | | 12/2007 | |
| KR | 10-2016-0027959 A | | 3/2016 | |
| TW | 201615389 A | | 5/2016 | |
| TW | 201834059 A | | 9/2018 | |
| TW | 201902619 A | | 1/2019 | |
| WO | WO-2007018391 A1 * | | 2/2007 | B24B 37/042 |
| WO | WO-2007131094 A2 * | | 11/2007 | B24B 21/04 |

OTHER PUBLICATIONS

International Search Report from International Application No. PCT/US19/065696, dated Apr. 2, 2020, 3 pages.

International Written Opinion from International Application No. PCT/US19/065696, dated Apr. 2, 2020, 11 pages.

Piezo Mechanics Design Tutorial: Fundamentals of Piezotechnology, Piezo Tutorial, Piezotechnology: Fundamentals of Piezielectricity, http:www.piezo.ws/peizoelectric_actuator_tutorial/Piezo_Design_part2.php, visited Nov. 27, 2018, 6 pages.

Ma et al., Rheology, Morphology and Mechanical Properties of Compatibilized Poly(vinylidene fluoride) (PVDF)/Termoplastic Polyurethane (TPU) Blends, Polymer Testing vol. 27, (2008), pp. 441-446.

Aerotech, Dedicated to the Science of Motion, Piezo Engineering Tutorial, https://aerotech.com/product-catalog/piezo-nanopositioners/piezo-engineering-tutorial.aspx, vised Nov. 27, 2018, 24 pages.

Taiwanese Office Action and Search Report for Application No. 108147770, dated Dec. 9, 2020, 9 pages.

Japanese Notice of Reasons for Refusal for Japanese Application No. 2021-543375, dated Aug. 23, 2022, 13 pages with English translation.

Chinese First Office Action for Chinese Application No. 201980090599. 3, dated Dec. 29, 2022, 30 pages with translation.

Jiang et al., Polyurethane-poly(vinylidene fluoride) (PU-PVDF) thin film composite membranes for gas separation, Journal of Membrane Science 323 (2008), pp. 371-378.

Korean Notice of Reasons for Rejection for Korean Application No. 10-2021-7027266, dated May 4, 2023, 15 pages with English translation.

* cited by examiner

POLISHING SYSTEM, POLISHING PAD, AND RELATED METHODS

TECHNICAL FIELD

Embodiments of the disclosure are generally related to the field of semiconductor processing and, more specifically, to planarization of semiconductor wafers.

BACKGROUND

Chemical-mechanical planarization (CMP) which for some applications may be characterized as chemical mechanical polishing, of semiconductor wafers during fabrication has been a commonly employed technique for many years. A CMP system generally consists of a rotatable polishing pad, a rotatable wafer carrier, and a fluid dispenser for dispensing a fluid, which may or may not comprise a slurry, onto the polishing pad during the CMP process. As a non-limiting example, one area of use for CMP is for the planarization of an individual layer (dielectric, metal, or a combination of dielectric and metal) during device fabrication on a semiconductor substrate. CMP removes undesirable topographical features of the IC layers, such as excess metal deposits subsequent to damascene processes, removal of excess oxide from shallow trench isolation (STI) steps, or planarizing inter-level dielectric (ILD) and inter-metal dielectric (IMD) layers. A primary purpose of CMP used in IC fabrication is to maintain surface planarity at each act of depositing and patterning sequential materials to maintain alignment of the various superimposed material levels and preserve critical dimensions of the features of the levels.

During the CMP process, the chemical interaction of the fluid (e.g., slurry) with the substrate forms a chemically modified layer at the polishing surface. Simultaneously, abrasives in the fluid may mechanically or chemically interact with chemically modified surface layers resulting in material removal. Polishing pads are typically made of a rigid, micro-porous polymeric material, such as polyurethane, and perform several functions including providing uniform fluid transport, distribution and removal of reacted products from the exposed surface of the wafer, and uniform distribution of applied Normal force (which may also be characterized in the industry as "pressure") applied by the polishing head across the wafer. At the nano- to micron-scale, the interaction of the pad and fluid in the formation and removal of the thin surface layer determine the removal rate (RR), surface planarity, surface non-uniformities, surface defects, and selectivity of material removal. In that regard, the localized material/tribological/mechanical properties of the polishing pad are significant to both local planarization of surface regions of the semiconductor substrate and global surface planarization achieved using the CMP process.

In many conventional CMP systems, there is no applied Normal force differential between different areas of the wafer, as such Normal force applied to the wafer is hard to control among all regions of the wafer surface. This problem, in turn, may cause a lack of uniformity of a chemical-mechanical planarization process across the entire surface of the wafer. The lack of uniformity, in turn, may cause a difference in the rate and extent of wafer material removal between a central area of the wafer and a peripheral area of the wafer. So, in practice, uniform wafer planarity quality is difficult to obtain.

In addition, the difference in the rate and extent of wafer material removal results in a difference in thickness between the central area of the wafer and the peripheral area of the wafer causes lights to be reflected differently from the wafer. Different reflection of light can easily lead to detection failure or false positives in the subsequent process, such as a defect scan process, performed on the wafer.

In attempts to address these issues, polishing pads of different hardnesses have been used to achieve different pressure distributions across the wafer surface, Multi-zone air bag polishing head technology has been employed to vary applied pressure on different, large regions of the wafer. However, such approaches have been unsuccessful in addressing surface topography anomalies on a wafer surface at a smaller, localized scale, such as micro-scale or nano-scale.

BRIEF DESCRIPTION OF THE DRAWINGS

For a detailed understanding of the present disclosure, reference should be made to the following detailed description, taken in conjunction with the accompanying drawings, in which like elements have generally been designated with like numerals, and wherein.

DETAILED DESCRIPTION

Figure 1:
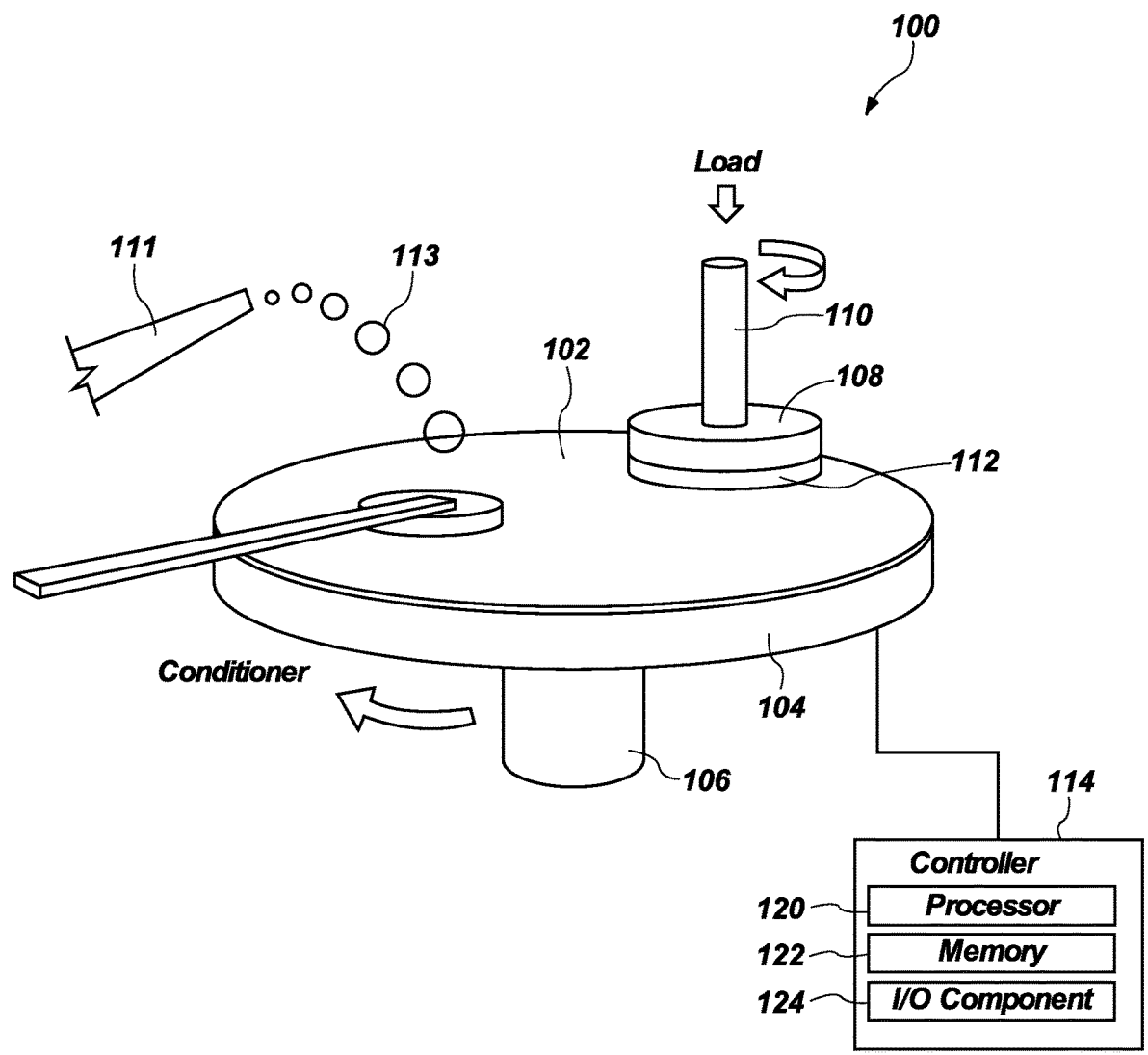
FIG. 1 is a schematic representation of a chemical-mechanical polishing system according to one or more embodiments of the present disclosure.

The illustrations presented herein are not actual views of any chemical-mechanical polishing system or any component thereof, but are merely idealized representations, which are employed to describe embodiments of the present invention.

As used herein, the singular forms following "a," "an," and "the" are intended to include the plural forms as well, unless the context clearly indicates otherwise.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, any relational term, such as "first," "second," "above," "upper," etc., is used for clarity and convenience in understanding the disclosure and accompanying drawings, and does not connote or depend on any specific preference or order, except where the context clearly indicates otherwise. For example, these terms may refer to orientations of elements of a chemical-mechanical polishing system and/or wafer in conventional orientations. Furthermore, these terms may refer to orientations of elements of a chemical-mechanical polishing system and/or wafer as illustrated in the drawings.

As used herein, the term "substantially" in reference to a given parameter, property, or condition means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" used in reference to a given parameter is inclusive of the stated value and has the meaning dictated by the context (e.g., it includes the degree of error associated with measurement of the given parameter, as well as variations resulting from manufacturing tolerances, etc.).

As used herein, the term "wafer" means and includes materials upon which and in which structures including feature dimensions of micrometer and nanometer scale are partially or completely fabricated. Such materials include conventional semiconductor (e.g., silicon) wafers, as well as bulk substrates of other semiconductor materials as well as other materials. For the sake of convenience, such materials will be referenced below as "wafers." Example structures formed on such materials may include, for example, integrated circuitry (active and passive), MEMS devices, and combinations thereof.

FIG. 1 is a schematic representation of a chemical-mechanical polishing system (referred to hereinafter as "CMP system") 100 according to one or more embodiments of the present disclosure. The CMP system 100 may include a polishing pad 102 mounted on a rotatable platen 104, which is attached to a rotatable platen shaft 106. The CMP system 100 may further include a rotatable head 108 secured to a rotatable head shaft 110 and a fluid dispenser 111 for dispensing fluid 113, which may comprise a slurry. A wafer 112 (i.e., substrate) to be polished may be mounted to the rotatable head 108. In operation, fluid 113 may be applied to the polishing pad 102, and both the polishing pad 102 and the rotatable head 108 may be rotated respectively by, and perpendicular to, the platen shaft 106 and head shaft 110 in the directions indicated by the arrows in FIG. 1. A normal force, designated in FIG. 1 as a "Load" may be applied to the rotatable head 108 by rotating head shaft 110 to cause the wafer 112 to contact the polishing pad 102 and the fluid 113 on the pad surface and be polished by interaction of the polishing pad 102 and the fluid 113 with material on the contacted surface of wafer 112.

In some embodiments, the CMP system 100 may further include a controller 114 for controlling operation of the CMP system 100. The controller 114 may include a processor 120 coupled to a memory 122 and an input/output component 124. The processor 120 may comprise a microprocessor, a field-programmable gate array, and/or other suitable logic devices. The memory 122 may include volatile and/or nonvolatile media (e.g., ROM, RAM, magnetic disk storage media, optical storage media, flash memory devices, and/or other suitable storage media) and/or other types of computer-readable storage media configured to store data. The memory 122 may store algorithms and/or instructions for determining anticipated paths of the wafer 112 across an upper surface of the polishing pad 102, for rotating the rotatable platen 104 and rotatable head 108, for applying fluid 113 to the polishing pad 102, for measuring voltages, and applying voltages, to be executed by the processor 120. In some embodiments, the processor 120 is operably coupled to send data to a computing device operatively coupled (e.g., over the Internet) to the controller 114, such as a server or personal computer. The input/output component 124 can include a display, a touch screen, a keyboard, a mouse, and/or other suitable types of input/output devices configured to accept input from and provide output to an operator.

As is described in greater detail below in regard to FIGS. 2-5, the polishing pad 102 may include an array of piezoelectric actuators (e.g., micro piezoelectric actuators) that are configured to sense a surface topography of the wafer 112 that the CMP is polishing. As is known in the art, a surface topography of a wafer may vary significantly, and in conventional systems, relatively high areas of an exposed level of material on the wafer surface may polish differently (e.g., experience a different rate and extent of material removal from the wafer surface) than relatively low areas of the wafer 112. This phenomenon results in over polishing or under polishing of different areas of the wafer surface, which may lead to high yield loss of dice from a wafer. Furthermore, the lack of edge tunability (i.e., ability to tune the polishing near an outer peripheral edge of the wafer 112) and the lack of ability to control uniformity of local over/under polish areas leads to high yield loss of dice from a wafer. Furthermore, the lack of edge tunability and the lack of an ability of control uniformity may cause problems in downstream processes such as, for example, subsequent nitride chemical-mechanical polishing processes. Additionally, the lack of edge tunability and the lack of an ability of control uniformity may affect edge uniformity.

Additionally, as is described in greater detail below, the array of piezoelectric actuators of the polishing pad 102 may be used to sense the topography of the wafer 112, and the controller 114 may adjust a localized topography (e.g., shape, size and height of an upper surface) of the polishing pad 102 to counter a sensed topographical non-uniformity of the wafer 112. For instance, the controller 114 may adjust an aggressiveness at which small, localized regions of the wafer 112 are polished in order to diminish and/or remove higher, non-uniform regions of the topography of wafer 112 which may provide improved within wafer uniformity. As used herein, the term "aggressiveness" may refer to a rate at which a given portion of the polishing pad 102 or the polishing pad 102 as whole removes material from a wafer 112 while polishing the wafer 112. For example, adjusting the topography of the polishing pad 102 may provide local, even micro- or nano-control of the aggressiveness of polishing pad removal of relatively high regions and low regions of the surface topography of wafer 112 and may reduce the area and degree of over-polished and under-polished regions of the surface of wafer 112 during a CMP process. As a result, the polishing pad 102 of the present disclosure may improve performance of the CMP system 100, may improve processing quality of the wafer 112 at each stage of fabrication, and may result in an increased yield of acceptable semiconductor dice throughout the surface of wafer 112 and in particular proximate the peripheral edge of the wafer 112.

Figure 2:
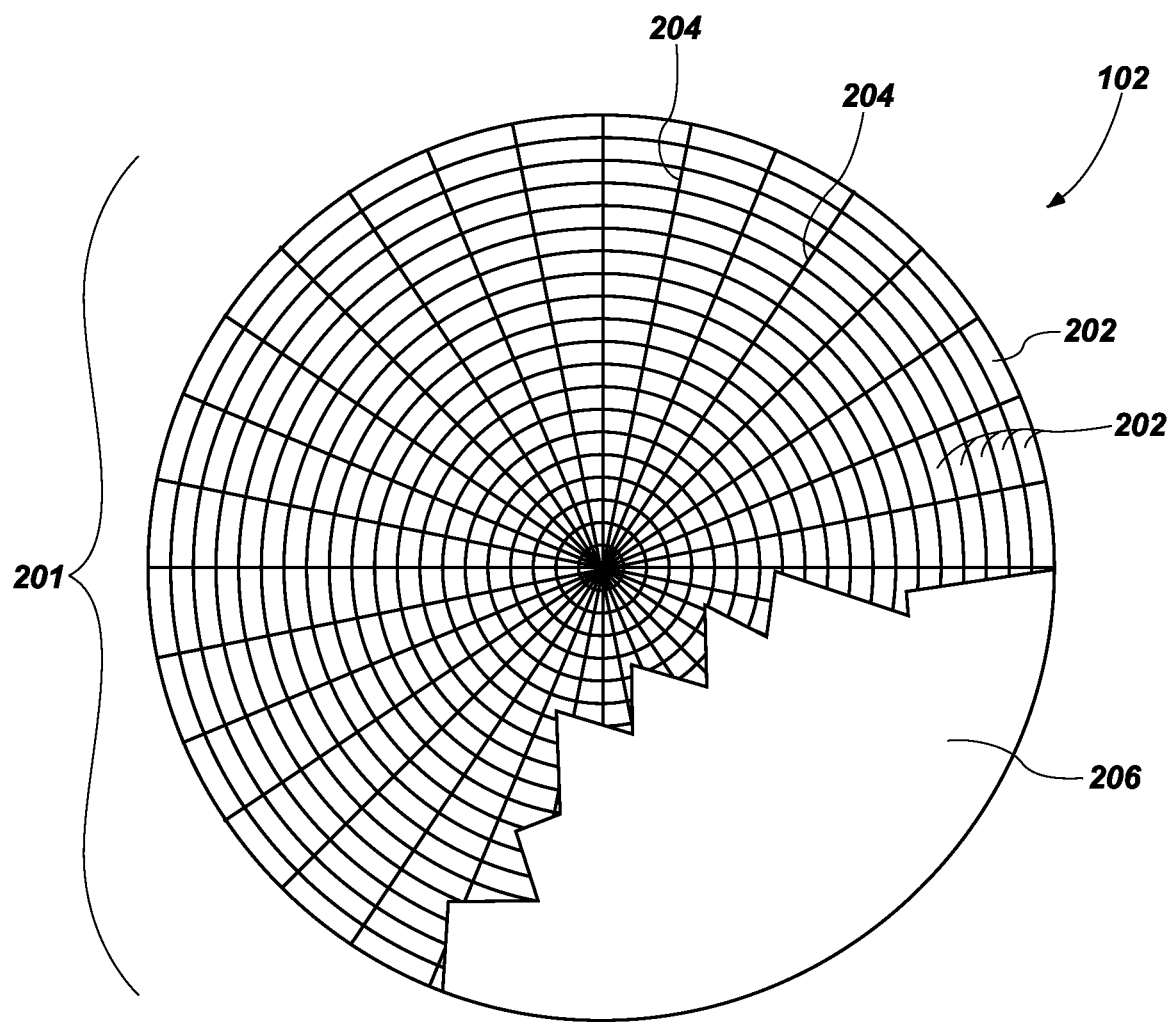
FIG. 2 is a top view of a polishing pad according to one or more embodiments of the present disclosure.

FIG. 2 is a top view of a polishing pad 102 according to one or more embodiments of the present disclosure. In some embodiments, the polishing pad 102 may include an array 201 of piezoelectric actuators 202 (e.g., micro piezoelectric actuators 202). As is described in further detail in regard to FIGS. 3A and 3B, term "piezoelectric," as used herein, may refer to elements that generate (i.e., output) a voltage when subjected to mechanical stress and/or elements that convert electrical energy (e.g., an applied voltage or electrical field) into linear displacement.

In some embodiments, the array 201 of piezoelectric actuators 202 may define a general circular shape (e.g., corresponding to a shape and size of the polishing pad 102). For instance, the piezoelectric actuators 202 of the array 201 may be sized and oriented relative to one another to define the general circular shape. In some embodiments, the piezoelectric actuators 202 may be oriented immediately adjacent to each other. For instance, the piezoelectric actuators 202 may comprise at least substantially an entirety of a body of the polishing pad 102. In additional embodiments, a filler material may be disposed between at least some of the piezoelectric actuators 202 of the array 201 of piezoelectric actuators 202. For instance, polyurethane of the pad material may be disposed between adjacent piezoelectric actuators 202. In some embodiments, the array 201 of piezoelectric actuators 202 may define an at least substantially planar upper surface of the polishing pad 102 when not activated, such substantially planar upper surface optionally being covered with another material, as discussed below.

In one or more embodiments, each of the piezoelectric actuators 202 may have an arcuate shape. Furthermore, the array 201 of piezoelectric actuators 202 may define a plurality of concentric circles of piezoelectric actuators 202, each concentric circle of piezoelectric actuators 202 including multiple arcuate shaped, mutually laterally adjacent piezoelectric actuators 202. Furthermore, in some embodiments, the boundaries 204 of the piezoelectric actuators 202 within a given concentric circle may be aligned along a common radius with boundaries 204 of piezoelectric actuators 202 of radially adjacent concentric circles. Accordingly, boundaries 204 of the piezoelectric actuators 202 may extend radially outward from a center of the array 201 of piezoelectric actuators 202. However, the array 201 of piezoelectric actuators 202 depicted in FIG. 2 is shown for illustration purposes, and the array 201 of piezoelectric actuators 202 may include any arrangement of piezoelectric actuators 202 to provide an array 201. For instance, each of the piezoelectric actuators 202 may have a circular shape, rectangular shape, hexagonal shape, octagonal shape, or any other geometric shape, and a combination of actuator shapes and sizes may be employed to form an array.

Additionally, each of the piezoelectric actuators 202 may be separately operably coupled to the controller 114 (FIG. 1) via, for example, a suitable bus structure. For instance, each of the piezoelectric actuators 202 may be electrically connected to the controller 114 (FIG. 1) such that the controller 114 can measure voltages output by individual piezoelectric actuators 202 and can apply electrical energy (e.g., voltages, electrical fields, etc.) of varying magnitudes to the piezoelectric actuators 202.

Moreover, although the piezoelectric actuators 202 are shown with larger dimensions in FIG. 2, as noted above, the piezoelectric actuators 202 may include micro-piezoelectric actuators 202. In particular, the piezoelectric actuators 202 may include at least one dimension in a major plane of the polishing pad 102 that is less than 100 μm. For instance, in some embodiments, each piezoelectric actuator 202 may comprise a film of material. In further embodiments, the piezoelectric actuators 202 may include nano-piezoelectric actuators 202. Specifically, the piezoelectric actuators 202 may include at least one dimension in a major plane of the polishing pad 102 that is less than 100 nm.

In one or more embodiments, the piezoelectric actuators 202 may include polyvinylidene fluoride (PVDF) polymer. PVDF polymer is useful in sensing applications because PVDF polymer has a piezoelectric voltage constant around 216 V/m/N/m². Furthermore, PVDF polymer has a higher voltage constant than most other piezoelectric materials. Additionally, PVDF polymer exhibits a much lower density than other piezoelectric crystals, which provides enhanced structural flexibility and enables its usage for sensing applications. In some embodiments, the piezoelectric actuators 202 may include a composite including PVDF and polyurethane (PU). In additional embodiments, the piezoelectric actuators 202 may include one or more other piezoelectric materials such as quartz, lead zirconate titanate (PZT), poly vinyl carbonate (PVC), Nylon 11, and barium titanate.

In some embodiments, the polishing pad 102 may further include a polishing cover 206 for protecting the piezoelectric actuators 202 from the fluid 113 (FIG. 1) and for providing a surface exhibiting a topography, density and hardness suitable for interfacing directly with the wafer 112 (FIG. 1). The use of such a cover may allow the same polishing pad 102 to be employed in a variety of CMP processes involving the removal of different materials from a wafer surface. The polishing cover 206 is partially removed in FIG. 2 to better show the structure of the polishing pad 102. In one or more embodiments, the polishing cover 206 may include polyurethane. In other embodiments, the polishing cover 206 may comprise any other suitable polymer or material usable in polishing pads. Furthermore, the polishing cover 206 may be relatively thin and, therefore, very flexible to allow the surface of polishing cover 206 to conform to a surface topography of wafer 112 (FIG. 1) when pressed against the polishing pad 102. Such conformability may enhance the sensing capabilities of piezoelectric actuators 202, as well as the localized, focused transfer of upward Normal force from activated piezoelectric actuators against wafer 112. In some embodiments, the polishing cover 206 may comprise a film of material. In further embodiments, the polishing pad 102 may not include a discrete polishing cover. Rather, the piezoelectric actuators 202 may be embedded within a body of polyurethane or other pad material, and piezoelectric actuators 202 may not be exposed through the body.

In some embodiments, the polishing pad 102 may have an upper body (e.g., layer) and a lower body (e.g., layer) disposed beneath the upper body. The upper body may comprise the polishing cover 206. Furthermore, in one or more embodiments, the upper body may include portions of a conventional polishing pad. For instance, the upper body may include a polymeric (e.g., polyurethane, polyolefin, polycarbonate, etc.) body having pores and/or grooves formed therein. For instance, the upper body may include portions of any conventional open-pore or closed-pore polishing pad. Furthermore, the upper body may be sufficiently flexible to transfer forces experienced by the upper body due to contact with the wafer 112 to the lower body. The lower body of the polishing pad 102 may include any of the arrays 201 of piezoelectric actuators 202 described herein.

Figures 3A, 3B:
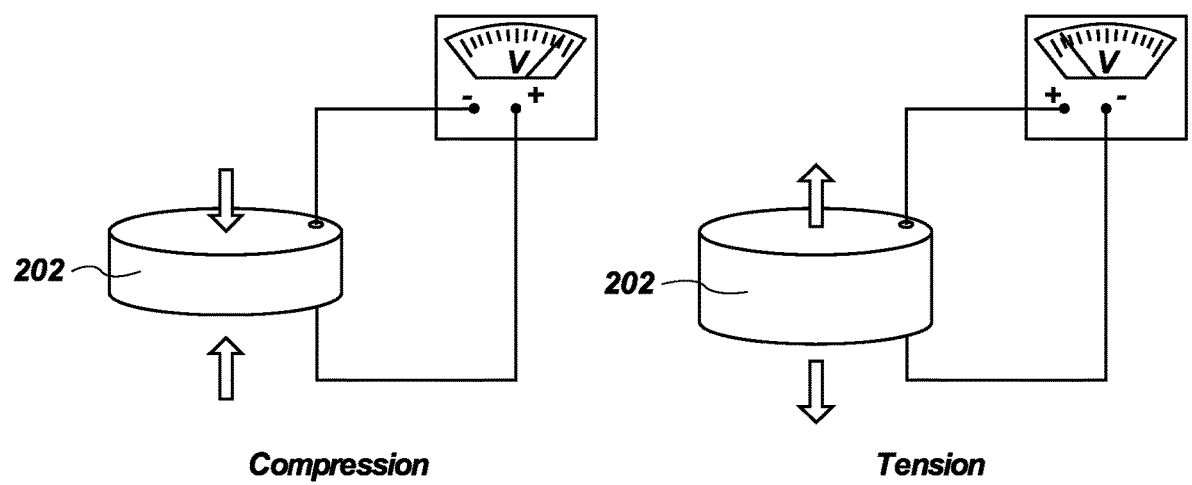
FIGS. 3A and 3B are schematic representations of functions of piezoelectric actuators when exhibiting the piezoelectric effect and the reverse piezoelectric effect according to one or more embodiments of the present disclosure.

As noted above, the piezoelectric actuators 202 may exhibit both the piezoelectric effect (i.e., accumulate electrical charges when subjected to mechanical stress (e.g., compressive or tensile stress)) and the reverse piezoelectric effect (i.e., converting applied electrical energy to mechanical stress (i.e., compression or tension)), in each instance the stress resulting in a dimensional change in the material of piezoelectric actuator 202. FIGS. 3A and 3B are schematic representations of functions of piezoelectric actuators 202 when respectively exhibiting the piezoelectric effect and the reverse piezoelectric effect. Referring to FIGS. 1, 2, and 3A together, when a piezoelectric actuator 202 is subjected to compression, the piezoelectric actuator 202 may generate (e.g., output) a voltage, and likewise, increasing a voltage applied (e.g., applying a positive voltage) to the piezoelectric actuator 202 may cause the piezoelectric actuator 202 undergo compression creating a negative dimensional displacement as indicated by facing arrows. Referring to FIGS. 1, 2, and 3B together, when a piezoelectric actuator 202 is subjected to tension, the piezoelectric actuator 202 may generate (e.g., output) a voltage, and likewise, decreasing a voltage applied (e.g., applying a negative voltage) to the piezoelectric actuator 202 may cause the piezoelectric actuator 202 to undergo tension and consequent positive dimensional displacement, as indicated by opposing arrows. In view of the foregoing, increasing or decreasing an applied voltage to the piezoelectric actuator 202 will change the relatively displacement of the piezoelectric actuator 202. In some embodiments, the piezoelectric actuator 202 exhibits displacement in a direction orthogonal to a direction of rotation of the polishing pad 102 upon activation.

Furthermore, a displacement exhibited by the piezoelectric actuator 202 when subjected to a given voltage is a function of the applied electric field strength E, the length L of the piezoelectric actuator 202, and properties of the material of the piezoelectric actuator 202. For example, the displacement of the piezoelectric actuator 202 is represented by the following equation:

$$\Delta L = \pm E \cdot d_{ij} \cdot T_0 \tag{1}$$

where $d_{ij}$ represents the strain coefficients of the piezoelectric material, $T_0$ represents the thickness (e.g., original length) of the piezoelectric actuator 202 and $\Delta L$ represents a change in the length of the piezoelectric actuator 202, as is known in the art.

Figure 4:
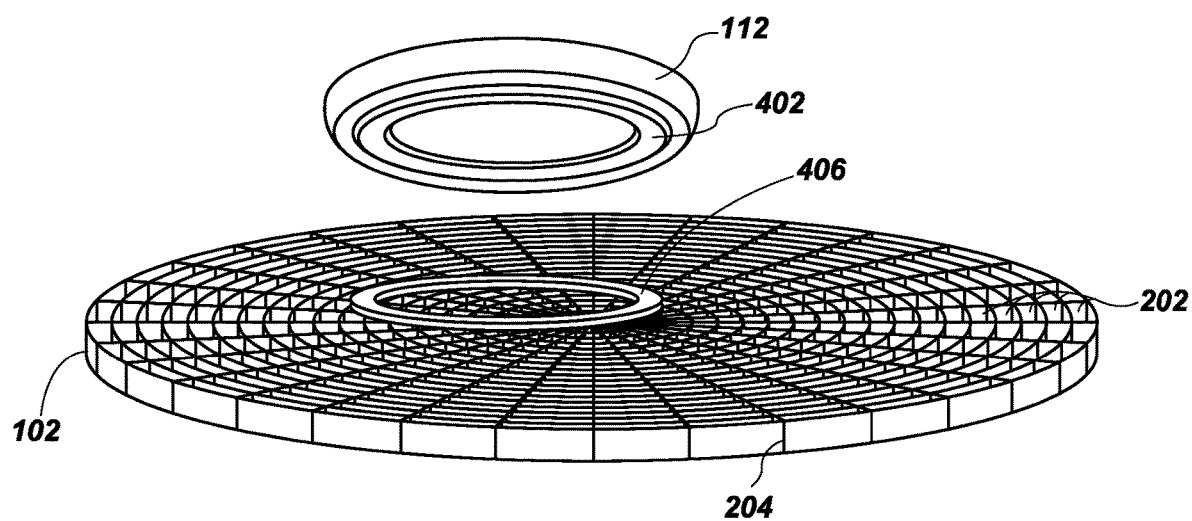
FIG. 4 is a schematic representation of a polishing pad as described herein and a wafer having a non-uniform structure formed thereon according to one or more embodiments of the present disclosure.

FIG. 4 is a schematic representation of a polishing pad 102 as described herein and a wafer 112 having a non-uniform topographical surface feature 402. As used herein, the term "non-uniform feature" may refer to a protrusion and/or depression that protrudes and/or is recessed, respectively, relative to a desired uniform surface topography of the wafer 112. In some embodiments, the non-uniform feature 402 may include an over-polished or under polished region of the surface of wafer 112. In one or more embodiments, the non-uniform feature 402 may include a region of the wafer 112 that projects downward toward the polishing pad 102 from the rotatable head 108 (FIG. 1) more than another portion of the wafer 112 due to a bow, bend, or flexure in the wafer 112. For instance, the non-uniform feature 402 may refer to a region of the wafer 112 proximate an outer peripheral edge of the wafer 112 (e.g., an edge of the wafer 112). For the example depicted in FIG. 4, the non-uniform feature 402 has a general circular shape to facilitate description. However, it is understood that the non-uniform feature 402 may have any shape.

Referring to FIGS. 1 and 4 together, in operation, as mentioned above in regard to FIG. 1, the wafer 112 may be pressed down against the polishing pad 102. Upon being pressed against the polishing pad 102, the piezoelectric actuators 202 correlating to the position of the non-uniform feature 402 (i.e., pressed against the non-uniform feature 402) may undergo tension or compression depending on a topography of the non-uniform structure 402 and may generate (e.g., output) a voltage detectable by the controller 114 due to the tension or compression. In some embodiments, all of the piezoelectric actuators 202 pressed against the wafer 112 (e.g., correlating to a position of the wafer 112 on the polishing pad 102) may experience at least some tension or compression and may generate (i.e., output) a voltage based on experiencing compression or tension.

The controller 114 may measure the voltages output by the piezoelectric actuators 202 responsive to contact with the surface of wafer 112. For instance, as mentioned above, each of the piezoelectric actuators 202 may be operably connected to the controller 114 such that voltages output by the piezoelectric actuators 202 are measureable by the controller 114. Based on the output voltages, the controller 114 may determine displacements of the various piezoelectric actuators 202 caused by contact with the surface of wafer 112, including contact with the non-uniform feature 402. As a result, the controller 114 may determine a surface topography of the wafer 112 including the topography (e.g., location, size, shape and height) of the non-uniform feature 402. For instance, the controller 114 may utilize equation 1 described above and/or other conventional algorithms applied to sensed voltage output, and thus positive or negative dimensional displacement of each piezoelectric actuator 202 to determine the surface topography of the wafer 112 and/or the surface topography of the non-uniform feature 402. In some embodiments, all of the sensed voltages may indicate applied compression, and the controller 114 may determine a surface topography of the wafer 112 including the surface topography of the non-uniform structure 402 based on relative voltages. In some embodiments, the topography of the wafer 112 may be determined relative to an overall planar (e.g., flat or flatter) surface of the wafer. For instance, in some embodiments, the CMP system 100 may measure the surface topography of the wafer 112 qualitatively relative to the overall planar surface.

Based on the determined surface topography of the non-uniform structure 402, the controller 114 may determine a desirable counter (e.g., an adjusted) surface topography of the polishing pad 102 to diminish and/or remove the non-uniform feature 402 from the surface of wafer 112 via the CMP process and to provide more uniformity to the surface, including the edges, of the wafer 112. For instance, the controller 114 may determine necessary displacements of the piezoelectric actuators 202 to adjust the aggressiveness of regions of the polishing pad 102 in order to diminish and/or remove the non-uniform feature 402 from the wafer 112 and to provide more uniformity to the surface of the wafer 112. Furthermore, based on the determined counter topography of the polishing pad 102, the controller 114 may determine which piezoelectric actuators 202 to activate (e.g., cause to undergo compression or tension) and the degree of dimensional displacement of each such piezoelectric actuator 202. For instance, for a piezoelectric actuator 202 correlating to a high portion (e.g., protrusion) of the non-uniform feature 402, the controller 114 may determine to cause the piezoelectric actuator 202 to undergo tension (e.g., protrude) to increase an aggressiveness at which the polishing pad 102 polishes (e.g., removes material from) the high portion of the non-uniform structure 402. Likewise, for a piezoelectric actuator 202 correlating to a low portion (e.g., recess) of the non-uniform feature 402, the controller 114 may determine to cause the piezoelectric actuator 202 to undergo relative compression (e.g., recede or retract) to decrease an aggressiveness at which the polishing pad 102 polishes (e.g., removes material from) the low portion of the non-uniform feature 402.

Based on determined displacements, the controller 114 may determine the necessary voltages to apply to the piezoelectric actuators 202 to achieve the necessary displacements and the counter topography of the polishing pad 102. For instance, the controller 114 may utilize equation 1 described above or any other known, suitable equations and/or algorithms to determine the necessary voltages to achieve the necessary displacements of the piezoelectric actuators 202 depending on the material characteristics thereof.

Upon determining the counter topography of the polishing pad 102 (i.e., necessary displacements of the piezoelectric actuators 202), the controller 114 may activate one or more regions of piezoelectric actuators 202 correlating to the non-uniform feature 402 (indicated with reference numeral 406) to achieve the counter topography on the polishing pad 102. For example, the controller 114 may apply electrical energy (e.g., voltages, electric fields, etc.) to the piezoelectric actuators 202 to cause the piezoelectric actuators 202 to undergo levels of compression or tension in order to achieve the counter topography of the polishing pad 102. As noted above, the controller 114 may cause piezoelectric actuators 202 to undergo tension to increase an aggressiveness at which the polishing pad 102 polishes regions of the wafer 112 and/or may cause piezoelectric actuators 202 to undergo compression to decrease an aggressiveness at which the polishing pad 102 polishes regions of the wafer 112.

Furthermore, the controller 114 may determine, based on a known rotation rate and motion of the rotatable head 108 and a known rotation rate of the rotatable platen 104 and polishing pad 102, an anticipated path of the non-uniform feature 402 across an upper surface of the polishing pad 102 during a CMP process. Moreover, based on the determined path, the controller 114 may selectively activate piezoelectric actuators 202 along the determined path of the non-uniform structure 402 as the non-uniform feature 402 reaches those piezoelectric actuators 202, and deactivate the same piezoelectric actuators 202 after passage of the non-uniform feature 402. Accordingly, the controller 114 may be continuously, rapidly measuring voltages output by the piezoelectric actuators 202 and equally rapidly activating and deactivating piezoelectric actuators 202 along a determined path of the non-uniform structure 402 of the wafer 112 to adjust the aggressiveness of polishing the non-uniform feature 402 to diminish and/or remove the non-uniform feature 402 from the wafer 112. As a result, the non-uniform feature 402 may be diminished and/or removed without over polishing and/or under polishing other regions of the wafer 112.

In some embodiments, the controller 114 may include a closed loop system that is continuously monitoring the piezoelectric actuators 202 for voltages and/or changes in voltages. Furthermore, the controller 114 is continuously activating and deactivating piezoelectric actuators 202 during the CMP process. Additionally, the controller 114 may include sensors for sensing the rotation rates and positions of the rotatable head 108 and polishing pad 102.

Adjusting the topography of the polishing pad 102 to adjust the aggressiveness at which regions of the wafer 112 are polished based on a measured and a determined surface topography of the wafer 112 may provide additional advantages over conventional CMP systems. For instance, adjusting the surface topography of the polishing pad 102 may provide improved edge tunability. For example, adjusting the surface topography of the polishing pad 102 may enable the aggressiveness at which the outer peripheral edge of the wafer 112 is polished to be tunable based on a surface topography of the wafer 112. Furthermore, adjusting the surface topography of the polishing pad 102 may enable an aggressiveness of the polishing pad 102 to be adjusted (i.e., tuned) on at least a microscale. Accordingly, the CMP system 100 of the present disclosure may reduce and/or eliminate problems with over polishing and/or under polishing the outer peripheral edge or other regions of the wafer 112 based on sensed non-uniformities in the surface of wafer 112. Furthermore, the CMP system 100 of the present disclosure may provide improved "within wafer non-uniformity." In other words, the CMP system 100 of the present disclosure may reduce the number of and/or the magnitude of non-uniform features within the wafer 112. Reducing a number and/or magnitudes of non-uniform features within the wafer 112 may improve a quality of the wafer 112 and may lead to a higher yield of acceptable dice from the wafer 112 responsive to further processing procedures. For instance, reducing number and/or magnitudes of non-uniform features within the wafer 112 may provide controllability of over-polish at the peripheral edge of a wafer 112 at chop oxide CMP levels and later nitride CMP levels. Additionally, the CMP system 100 of the present disclosure may be applicant to any part type and to any CMP step of device production and is not limited to the examples described herein.

Figure 5:
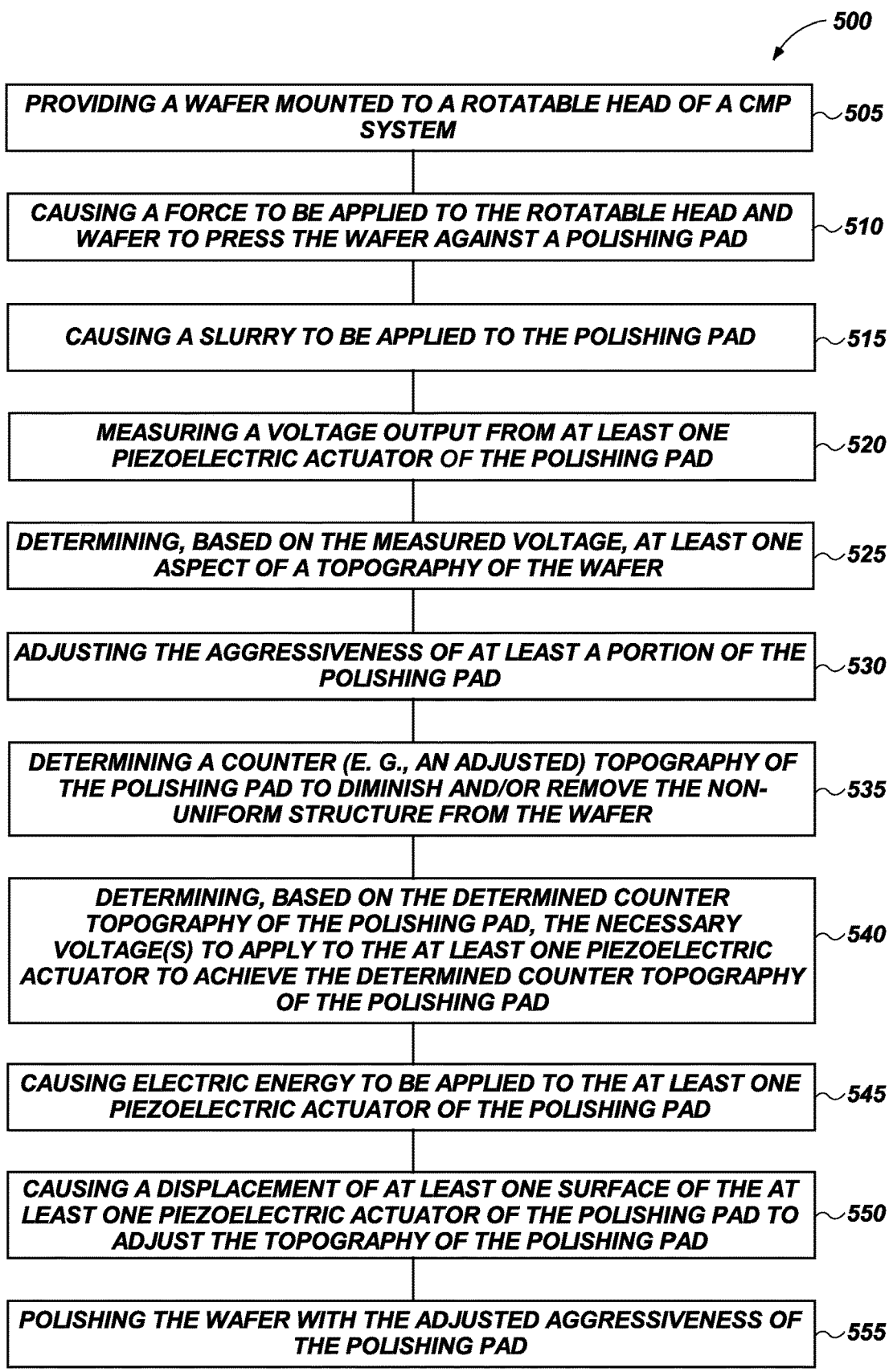
FIG. 5 is a flow diagram of a method of performing a chemical-mechanical polishing process on a wafer according to one or more embodiments of the present disclosure.

FIG. 5 is a flow diagram of a method 500 of performing a CMP process on a wafer according to one or more embodiments of the present disclosure. Referring to FIGS. 1-5 together, the method 500 may include providing a wafer 112 mounted to a rotatable head 108 of a CMP system 100, as shown in act 505 of FIG. 5. For instance, the method 500 may include providing a wafer 112 mounted to a rotatable head 108 of a CMP system 100 via any conventional methods. Additionally, act 505 may include providing a wafer 112 mounted to a rotatable head 108 above a polishing pad 102.

The method 500 may further include causing a force to be applied to the rotatable head 108 and wafer 112 to press the wafer 112 perpendicular to and against a polishing pad 102 attached to a rotatable platen shaft 106, as shown in act 510 of FIG. 5. For instance, the controller 114 may cause the wafer 112 to be pressed against the polishing pad 102 while the rotatable head 108 is rotating and while the polishing pad 102 is rotating in, for example, the directions indicated in FIG. 1. As a non-limiting example, the controller 114 may cause the wafer 112 to be pressed against the polishing pad 102 via any conventional methods, and the force controlled by a closed-loop feedback system, as known to those of ordinary skill in the art.

Additionally, the method 500 may include causing a fluid 113 to be applied to the polishing pad 102, as shown in act 515 of FIG. 5. For instance, the controller 114 may cause the fluid dispenser 111 to dispense fluid 113 to surface of the polishing pad 102 via conventional methods.

The method 500 may also include measuring a voltage output from at least one piezoelectric actuator 202 of the polishing pad 102, as shown in act 520. For example, as described above in regard to FIG. 2, each of the piezoelectric actuators 202 of the polishing pad 102 may be electrically connected to the controller 114 such that the controller 114 can measure voltages output by the piezoelectric actuators 202. In particular, force applied to the polishing pad 102 by pressing the wafer 112 against the polishing pad 102 may cause the at least one piezoelectric actuator 202 to compress or extend. Furthermore, due to the compression or extension (i.e., experiencing tension), the at least one piezoelectric actuator 202 may collect electric charge and/or output a voltage. The controller 114 may measure the magnitude and polarity of output voltage via a measurement device, such as, for example, a multimeter or data acquisition device.

Furthermore, the method 500 may include determining, based on the measured voltage, at least one aspect of a surface topography of the wafer 112, as shown in act 525. In some embodiments, determining at least one aspect of the topography of the wafer 112 may include identifying at least one anomaly in the form of non-uniform feature 402 within the wafer 112. In additional embodiments, determining the at least one aspect of the surface topography of the wafer 112 may include determining the surface topography of a region of the wafer 112 proximate an outer peripheral edge of the wafer 112. In other words, determining the at least one aspect of the surface topography of the wafer 112 may include determining the surface topography of the edges of the wafer 112. For example, based on the measured voltages, the controller 114 may determine a dimensional displacement of the at least one piezoelectric actuator 202 caused by contact with a portion of the wafer 112, for example with the non-uniform feature 402, and responsive to the determined dimensional displacement, the controller 114 may determine the nature and extent of the at least one aspect of the surface topography of the wafer 112, such as the surface topography of the non-uniform feature 402. For instance, the controller 114 may utilize equation 1 described above and/or other conventional algorithms to determine the at least one aspect of the surface topography of the wafer 112, such as the surface topography of the non-uniform feature 402. In one or more embodiments, the at least one aspect may include a protrusion relative to another surface portion of the wafer 112, a recess relative to another surface portion of the wafer 112, or the absence of a protrusion or recess in the wafer 112 (i.e., a planar surface). As noted above, in some embodiments, the topography of the wafer 112 may be determined relative to an overall planar (e.g., flat or flatter) surface of the wafer. For instance, in some embodiments, the CMP system 100 may measure the surface topography of the wafer 112 qualitatively relative to the overall planar surface.

In the event that the at least one aspect of the topography includes a non-uniform feature 402 (e.g., a protrusion, recess, over-polished area, under polished area, etc.), the method 500 also include adjusting the aggressiveness (i.e., polishing aggressiveness) of at least a portion of the polishing pad 102 to diminish and/or remove a non-uniform feature 402 in the topography of the wafer 112, as shown in act 530 of FIG. 5. In some embodiments, adjusting the aggressiveness of at least a portion of the polishing pad 102 may include determining a counter (e.g., an adjusted) surface topography of the polishing pad 102 to diminish and/or remove the non-uniform feature 402 from the wafer 112 via the CMP process, as shown in act 535. For example, the controller 114 may determine a desired displacement of the at least one piezoelectric actuator 202 to adjust the aggressiveness (i.e., a polishing aggressiveness) of a portion of the surface of polishing pad 102. Furthermore, based on the determined counter topography of the polishing pad 102, the controller 14 may determine which piezoelectric actuators 202 to activate (e.g., cause to undergo compression or tension) and how to activate the piezoelectric actuators 202. As a non-limiting example, if the at least one piezoelectric actuator 202 correlates to a high portion (e.g., protrusion) of the non-uniform feature 402, the controller 114 may determine to cause the at least one piezoelectric actuator 202 to undergo tension (e.g., protrude) to increase an aggressiveness at which the polishing pad 102 polishes (e.g., removes material from) the high portion of the non-uniform feature 402. Likewise, if the at least one piezoelectric actuator 202 correlates to a low portion (e.g., recess) of the non-uniform feature 402, the controller 114 may determine to cause the at least one piezoelectric actuator 202 to undergo compression (e.g., recede or retract) to decrease an aggressiveness at which the polishing pad 102 polishes (e.g., removes material from) the low portion of the non-uniform feature 402.

Additionally, act 530 may include determining, based on the determined counter topography of the polishing pad 102, the necessary voltage(s) to apply to the at least one piezoelectric actuator 202 to achieve the determined counter topography of the polishing pad 102, as shown in act 540. For instance, the controller 114 may utilize equation 1 described above or any other known equations and/or algorithms to determine the necessary voltage(s) to achieve the necessary displacement of the at least one piezoelectric actuators 202 to create the determined counter topography of the polishing pad 102.

Act 530 may further include causing electric energy (e.g., voltage, electric field, etc.) to be applied to the at least one piezoelectric actuator 202 of the polishing pad 102 (i.e., activating the at least one piezoelectric actuator 202), as shown in act 545. For example, the controller 114 may apply electrical energy (e.g., voltages, electric fields, etc.) to the at least one piezoelectric actuator 202 via one or more conventional power sources (e.g., AC power sources).

Act 530 may also include causing a displacement of at least one surface of the at least one piezoelectric actuator 202 of the polishing pad 102 facing wafer 112 to adjust the topography of the polishing pad 102, as shown in act 550. For instance, applying the electrical energy to the at least one piezoelectric actuator 202 may cause the at least one piezoelectric actuator 202 to undergo levels of compression or tension in order to achieve displacement of at least one surface of the at least one piezoelectric actuator 202. For example, causing the displacement of at least one surface of the at least one piezoelectric actuator 202 may include causing the at least one piezoelectric actuator 202 to exhibit the piezoelectric effect or the reverse piezoelectric effect.

Upon adjusting the aggressiveness of the polishing pad 102, the method 500 may further include polishing the wafer 112 with the adjusted aggressiveness of the polishing pad 102, as shown in act 555. For instance, the controller 114 may cause the rotatable head 108 and the polishing pad 102 to rotate (e.g., rotate in the directions indicated in FIG. 1) and may cause at least the portion of the polishing pad 102 having an adjusted aggressiveness to contact and polish the identified non-uniform feature 402.

In some embodiments, the method 500 may also include repeating acts 540-555 any number of times to diminish and/or remove non-uniform features from the topography of the wafer 112. Additionally, the method 500 may include determining, based on a known rotation rate and motion of the rotatable head 108 and a known rotation rate of the rotatable platen 104 and polishing pad 102, an anticipated path of the non-uniform feature 402 across an upper surface of the polishing pad 102 during a CMP process. Moreover, based on the determined path, the controller 114 may activate piezoelectric actuators 202 in the determined path of the non-uniform structure 402 as the non-uniform feature 402 reaches those piezoelectric actuators 202 and deactivate same after passage of non-uniform feature 402. Accordingly, the controller 114 may be continuously measuring voltages output by the piezoelectric actuators 202 and activating piezoelectric actuators 202 along a determined path of the non-uniform structure 402 of the wafer 112 to adjust the aggressiveness of polishing the non-uniform structure 402 to diminish and/or remove the non-uniform feature 402 from the wafer 112. As a result, method 500 may include diminishing and/or removing the non-uniform feature 402 without over polishing and/or under polishing other areas of the wafer 112.

The method 500 described herein may provide advantages over conventional CMP systems and process. For instance, adjusting the topography of the polishing pad 102 may provide improved wafer edge tunability. For example, adjusting the topography of the polishing pad 102 may enable the aggressiveness at which the outer peripheral edge of the wafer 112 is polished to be tunable based on a surface topography of the wafer 112. Furthermore, adjusting the topography of the polishing pad 102 may enable aggressiveness of the polishing pad 102 to be adjusted (i.e., tuned) on at least a microscale. Accordingly, the method 500 may reduce and/or eliminate problems with over and/or under polishing the outer peripheral edge or other regions of the wafer 112 based on non-uniformities in the wafer 112. Furthermore, the method 500 may provide improved "within wafer non-uniformity." In other words, the method 500 may reduce the number of and/or the magnitude of non-uniform structures within the wafer 112. Reducing a number and/or magnitudes of non-uniform structures within the wafer 112 may improve a quality of the wafer 112 and may lead to a higher yield of acceptable die from the wafer 112 in further processing procedures. For instance, reducing number and/or magnitudes of non-uniform structures within the wafer 112 may provide controllability of over-polish at the peripheral edge of a wafer 112 at chop oxide CMP levels and at later nitride CMP levels.

One or more embodiments of the present disclosure include a system having a rotatable head for mounting a wafer thereto, a polishing pad mounted to a rotatable platen, and a fluid dispenser for dispensing a fluid onto the polishing pad. The polishing pad may include an array of piezoelectric actuators. In some embodiments, each piezoelectric actuator of the array includes at least one dimension being less than 100 micrometers. In one or more embodiments, the array of piezoelectric actuators defines an at least substantially planar surface when not activated. Additionally, the polishing pad may further include a protection cover disposed over the array of piezoelectric actuators. In some embodiments, each of the piezoelectric actuators includes a polyvinylidene fluoride polymer.

The system may further include a controller operably coupled to each of the piezoelectric actuators of the array, the controller including: at least one processor; and at least one non-transitory computer-readable storage medium storing instructions thereon that, when executed by the at least one processor, cause the controller to measure voltages output by the piezoelectric actuators of the array, to determine a topography of at least a portion of a wafer based on measured voltages output by the piezoelectric actuators of the array, and to adjust an aggressiveness of at least one portion of the polishing pad. In some embodiments, the controller may adjust the aggressiveness of at least one portion of the polishing pad by activating one or more piezoelectric actuators of the array.

Some embodiments of the present disclosure include a polishing pad for a chemical-mechanical polishing system, the polishing pad comprising an array of piezoelectric actuators. In some embodiments, each piezoelectric actuator of the array includes at least one dimension being less than 100 micrometers. In one or more embodiments, the array of piezoelectric actuators defines an at least substantially planar surface when not activated. Additionally, the polishing pad may further include a protection cover disposed over the array of piezoelectric actuators. In some embodiments, each of the piezoelectric actuators includes a polyvinylidene fluoride polymer. In additional embodiments, the piezoelectric actuators of the array are immediately adjacent to each other. In further embodiments, the polishing pad may include an upper layer comprising a protection cover and a lower layer formed beneath the upper layer, wherein the array of piezoelectric actuators form at least substantially an entirety of the lower layer.

One or more embodiments of the present disclosure include a method of polishing a wafer. The method may include causing a wafer to be pressed against a polishing pad, measuring voltages output by piezoelectric actuators of the polishing pad, determining, based on the measured voltages, at least one aspect of a non-uniform structure of the wafer, adjusting an aggressiveness of at least a portion of the polishing pad by activating at least one piezoelectric actuator of the polishing pad and causing displacement of at least one surface of the at least one piezoelectric actuator, and polishing the non-uniform structure of the wafer with the activated at least one piezoelectric actuator of the polishing pad. The method may further include identifying an over or under polished region of the wafer, activating at least one piezoelectric actuator by applying electric energy to the at least one piezoelectric actuator, causing the at least one piezoelectric actuator to undergo a deformity due to the applied electric energy, determining an anticipated path of the non-uniform structure of the wafer across an upper surface of the polishing pad, and/or adjusting an aggressiveness of a portion of the polishing pad correlating to the anticipated path of the non-uniform structure of the wafer as the non-uniform structure reaches the portion of the polishing pad.

Some embodiments of the present disclosure include a method of polishing a wafer. The method may include causing a wafer to be pressed against a polishing pad, measuring voltages output by piezoelectric actuators of the polishing pad, determining, based on the measure voltages, a topography of a region of the wafer proximate an outer peripheral edge of the wafer, determining based on the determined topography whether the region is under polished or over-polished, adjusting an aggressiveness of at least a portion of the polishing pad by activating at least one piezoelectric actuator of the polishing pad and causing displacement of at least one surface of the at least one piezoelectric actuator, and polishing the region of the wafer proximate the outer peripheral edge of the wafer with the activated at least one piezoelectric actuator of the polishing pad. The method may further include identifying an over or under polished region of the wafer, activating at least one piezoelectric actuator by applying electric energy to the at least one piezoelectric actuator, causing the at least one piezoelectric actuator to undergo a deformity due to the applied electric energy, determining an anticipated path of the region of the wafer proximate the outer peripheral edge of the wafer across an upper surface of the polishing pad, and/or adjusting an aggressiveness of a portion of the polishing pad correlating to the anticipated path of the region of the wafer proximate the outer peripheral edge of the wafer as the region of the wafer reaches the portion of the polishing pad. The method may further include adjusting a topography of the polishing pad.

Additional embodiments of the present disclosure include a chemical-mechanical polishing system including a rotatable head for mounting a wafer thereto and a polishing pad mounted to a rotatable platen. The polishing pad may include an upper body comprising a porous polymeric body and a lower body disposed beneath the upper body and comprising an array of piezoelectric actuators.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternate useful combinations of the elements described, will become apparent to those skilled in the art from the description. Such modifications and embodiments also fall within the scope of the appended claims and equivalents.

What is claimed is:

1. A system, comprising:
   a rotatable head for mounting a wafer thereto;
   a polishing pad mounted to a rotatable platen, the polishing pad comprising an array of piezoelectric actuators, each piezoelectric actuator of the array of piezoelectric actuators configured to convert applied electrical energy to mechanical stress resulting in dimensional displacement of a thickness thereof in a direction orthogonal to a direction of rotation of the polishing pad to modify a surface of the polishing pad and configured to convert applied mechanical stress to output electrical energy;
   a fluid dispenser for dispensing a fluid onto the polishing pad; and
   a controller operably couple to the array of piezoelectric actuators, the controller comprising:
      at least one processor; and
      at least one non-transitory computer-readable storage medium storing instructions thereon that, when executed by the at least one processor, cause the controller to determine a topography of at least a portion of a surface of the wafer based on voltages output by the piezoelectric actuators of the array of piezoelectric actuators, determine a counter surface topography for at least a portion of the polishing pad based on the topography of the at least the portion of the surface of the wafer, and apply electrical energy to one or more piezoelectric actuators of the array of piezoelectric actuators to modify the polishing pad to include the counter surface topography.

2. The system of claim 1, wherein each piezoelectric actuator of the array comprises a micro-piezoelectric actuator including at least one of a length and a width of less than 100 micrometers.

3. The system of claim 1, wherein the array of piezoelectric actuators defines an at least substantially planar surface when not activated.

4. The system of claim 1, wherein the polishing pad further comprises a cover disposed over the array of piezoelectric actuators.

5. The system of claim 1, wherein each of the piezoelectric actuators comprises a polyvinylidene fluoride polymer.

6. A method of polishing a wafer, comprising:
   causing a surface of a rotating wafer mounted to a rotatable head to be pressed against a rotating polishing pad mounted to a rotatable platen, the polishing pad including an array of piezoelectric actuators, each piezoelectric actuator of the array of piezoelectric actuators configured to convert applied electrical energy to mechanical stress resulting in dimensional displacement of a thickness thereof in a direction orthogonal to a direction of rotation of the polishing pad and configured to convert applied mechanical stress to output electrical energy;
   dispensing fluid onto the polishing pad via a fluid dispenser;
   measuring with a controller, output respectively by piezoelectric actuators of the array of piezoelectric actuators of the polishing pad, the controller operably coupled to the array of piezoelectric acuators;
   determining, with a controller based on the measured voltages, a topography of at least a portion of the surface of the wafer including a non-uniform feature of the surface;
   determining, with the controller, a counter surface topography for at least a portion of the polishing pad based on the topography of the at least the portion of the surface of the wafer;
   applying electrical energy to one or more piezoelectric actuators of the array of piezoelectric actuators to modify the polishing pad to include the counter surface topography; and
   polishing the non-uniform feature of the surface of the wafer with the counter surface topography of the polishing pad.

7. The method of claim 6, wherein determining topography of at least a portion of the wafer comprises identifying an over-polished or under polished region of the wafer.

8. The method of claim 6, wherein applying electrical energy to one or more piezoelectric actuators of the array of piezoelectric actuators to modify the polishing pad to include the counter surface topography comprises causing the one or more piezoelectric actuators to undergo a deformity responsive to the applied electrical energy.

9. The method of claim 6, further comprising determining an anticipated path of the non-uniform feature of the wafer across an upper surface of the polishing pad.

10. The method of claim 9, further comprising adjusting an aggressiveness of a portion of the polishing pad correlating to the anticipated path of the non-uniform feature of the wafer as the non-uniform feature reaches the portion of the polishing pad by modifying the counter surface topography of the polishing pad.

11. A method of polishing a wafer, comprising:
   causing a wafer mounted to a rotatable head to be pressed against a polishing pad mounted to a rotatable platen, the polishing pad comprising an upper body comprising a porous polymeric body and a lower body disposed beneath the upper body and comprising an array of piezoelectric actuators, each piezoelectric actuator of the array of piezoelectric actuators separately operably coupled to a controller and configured for dimensional displacement, an amount of the dimensional displacement relative to a magnitude of electrical energy applied thereto;
   dispensing fluid onto the polishing pad via a fluid dispenser;
   measuring voltages output by piezoelectric actuators of the array of piezoelectric actuators of the polishing pad responsive to contact of the wafer with the polishing pad;
   determining, based on the measured voltages, a topography of a region of the surface of the wafer proximate an outer peripheral edge of the wafer;
   determining based on the determined topography whether the region is under polished or over-polished;
   adjusting an aggressiveness of at least a portion of the polishing pad by activating piezoelectric actuators of the array of piezoelectric actuators, comprising causing, by a controller, application of the electrical energy at varying magnitudes to at least some of the array of piezoelectric actuators facing the wafer to modify a surface topography of the polishing pad; and polishing the region of the wafer proximate the outer peripheral edge of the wafer with the modified surface topography of the polishing pad.

12. The method of claim 11, wherein adjusting the aggressiveness of at least a portion of the polishing pad by activating the piezoelectric actuators comprises causing the piezoelectric actuators to undergo a deformity due to the applied electrical energy.

13. The method of claim 11, further comprising determining an anticipated path of the region of the wafer proximate the outer peripheral edge of the wafer across an upper surface of the polishing pad.

14. The method of claim 13, further comprising adjusting the aggressiveness of a portion of the polishing pad correlating to the anticipated path of the region of the wafer proximate the outer peripheral edge of the wafer as the region of the wafer reaches the portion of the polishing pad.

15. A polishing system comprising:
- a rotatable head for mounting a wafer thereto;
- a polishing pad mounted to a rotatable platen, the polishing pad comprising:
  - an upper body comprising a porous polymeric body; and
  - a lower body disposed beneath the upper body and comprising an array of piezoelectric actuators, each piezoelectric actuator of the array of piezoelectric actuators separately operably coupled to a controller and configured for dimensional displacement, an amount of the dimensional displacement relative to a magnitude of electrical energy applied thereto; and
- the controller comprising:
  - at least one processor; and
  - at least one non-transitory computer-readable storage medium storing instructions thereon that, when executed by the at least one processor, cause the controller to apply the electrical energy at varying magnitudes to at least some of the array of piezoelectric actuators to modify a surface topography of the polishing pad.

16. The polishing system of claim 15, wherein each piezoelectric actuator of the array comprises a micro-piezoelectric actuator including at least one of a length and a width being less than 100 micrometers.

17. The polishing system of claim 15, wherein the array of piezoelectric actuators defines an at least substantially planar surface when not activated.

18. The polishing system of claim 15, wherein each of the piezoelectric actuators comprises a polyvinylidene fluoride polymer.

19. The polishing system of claim 15, wherein the controller further comprises instructions that, when executed by the at least one processor cause the controller to measure voltages output by the piezoelectric actuators of the array.

20. The polishing system of claim 19, wherein the controller further comprises instructions that, when executed by the at least one processor, cause the controller to determine a topography of at least a portion of a wafer responsive to measured voltages output by the piezoelectric actuators of the array in contact with the at least a portion of the wafer.

21. The polishing system of claim 19, wherein the controller further comprises instructions that, when executed by the at least one processor, cause the controller to adjust an aggressiveness of at least one portion of the polishing pad by modifying the surface topography of the polishing pad.

22. The polishing system of claim 19, wherein the controller further comprises instructions that, when executed by the at least one processor, cause the controller to adjust an aggressiveness of at least one portion of the polishing pad by selectively activating one or more piezoelectric actuators of the array to modify the surface topography of the polishing pad.

23. The polishing system of claim 15, wherein each piezoelectric actuator of the array of piezoelectric actuators is configured to convert the applied electrical energy to mechanical stress resulting in the dimensional displacement of the thickness thereof in a direction orthogonal to a direction of rotation of the polishing pad to modify the surface topography of the polishing pad.

* * * * *